(12) United States Patent
Oiwa

(10) Patent No.: US 7,088,984 B2
(45) Date of Patent: Aug. 8, 2006

(54) ELECTRONIC TUNER

(75) Inventor: Koji Oiwa, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 412 days.

(21) Appl. No.: 10/457,402

(22) Filed: Jun. 10, 2003

(65) Prior Publication Data

US 2004/0029551 A1 Feb. 12, 2004

(30) Foreign Application Priority Data

Aug. 7, 2002 (JP) .............................. 2002-229629

(51) Int. Cl.
*H04B 1/16* (2006.01)
(52) U.S. Cl. ................. 455/339; 455/188.1; 455/191.3; 455/293; 348/731; 334/59
(58) Field of Classification Search ................ 455/339, 455/334, 341, 293, 255, 257, 343.1, 3.06, 455/130, 141, 154.1, 161.1, 173.1
See application file for complete search history.

(56) References Cited

U.S. PATENT DOCUMENTS

| 4,267,604 | A | * | 5/1981 | Sato .......................... 455/193.2 |
| 4,271,529 | A | * | 6/1981 | Strammello, Jr. ......... 455/180.4 |
| 4,326,295 | A | * | 4/1982 | Matsumoto et al. ...... 455/188.2 |
| 4,484,355 | A | * | 11/1984 | Henke et al. ................. 455/76 |
| 4,771,332 | A | * | 9/1988 | Metoki ....................... 348/731 |
| 5,212,828 | A | * | 5/1993 | Hatashita et al. ........... 455/295 |
| 5,930,696 | A | * | 7/1999 | Tzuang et al. ............... 455/311 |
| 6,301,117 | B1 | * | 10/2001 | Yamauchi et al. .......... 361/728 |
| 6,891,575 | B1 | * | 5/2005 | Matsuura ..................... 348/731 |
| 6,903,783 | B1 | * | 6/2005 | Yamamoto ................... 348/731 |

FOREIGN PATENT DOCUMENTS

| CN | 98117355.1 | 2/1999 |
| EP | 0 898 365 A1 | 2/1999 |
| JP | 4-105723 U | 9/1992 |
| JP | 09-130285 | 5/1997 |

* cited by examiner

*Primary Examiner*—Edward F. Urban
*Assistant Examiner*—Thuan Nguyen
(74) *Attorney, Agent, or Firm*—Birch, Stewart, Kolasch & Birch, LLP

(57) ABSTRACT

An electronic tuner of the present invention is arranged such that between an input part of the amplifying circuit and the ground serially connected are a coil and a diode, and a capacitor is connected between the ground and a connecting part between the coil and the diode. The diode is brought into conduction when a voltage supplied from a VHF High control source is at High level, and the coil and input capacitance of the amplifying circuit makes up a gain correction circuit for improving a frequency characteristic of a received signal in a VHF High band. The diode is brought out of conduction when a voltage supplied from a VHF High control source is at Low level, and the coil and the capacitor makes up a trap circuit for improving a frequency characteristic of a received signal in a VHF Low band. This makes it possible to minimize price increase of the apparatus and to improve frequency characteristics in the VHF High band and VHF Low band.

8 Claims, 7 Drawing Sheets

ELECTRONIC TUNER

This application claims priority under 35 U.S.C. 119 of Japanese Application No. 2002-229629, filed Aug. 7, 2002, the entire of disclosure of which is hereby incorporated by reference.

FIELD OF THE INVENTION

The present invention relates to an electronic tuner for use in selecting TV stations in apparatuses such as TV, VTR, and CATV.

BACKGROUND OF THE INVENTION

Typically, an electronic tuner is an apparatus for selecting one signal from among a large number of signals sent from TV stations to receive a desired program.

Referring to FIG. 10, the following will explain the electronic tuner. FIG. 10 is a block diagram showing a typical electronic tuner.

As shown in FIG. 10, receiver signals supplied from an RF-IN terminal of a station-selecting section are first screened to pick out only a desired signal by a band-pass filter 101 (BPF (1)) which operates in accordance with a tuning voltage from a power source 106. Thereafter, the desired signal goes to an AMP 102 to be amplified. Next, the amplified receiver signal is further screened by a band-pass filter 103 (BPF (2)) which operates in accordance with a tuning voltage from the power source 106, and goes to a mixer circuit 104 (MIX).

The mixer circuit 104 is connected to a local oscillator circuit 105 (VCO) which can change an oscillation frequency with a tuning voltage from the power source 106. This local oscillator circuit 105 oscillates a local oscillation signal (LOCAL) in accordance with a tuning voltage and outputs it to the mixer circuit 104.

The mixer circuit 104 performs frequency conversion by mixture of the receiver signal with the local oscillation signal and outputs the frequency-converted receiver signal to an IF-OUT terminal.

This signal outputted to the IF-OUT terminal is referred to as IF signal. The frequency of this IF signal is determined by the difference in frequency between the local oscillation signal and the receiver signal.

Therefore, since the frequency of local oscillation signal is changed in proportion to the desired signal supplied from the RF-IN terminal, the frequency of IF signal is always constant.

Thus, the frequency of the IF signal is always constant, so that it is possible to select only a particular station and receive a program from the selected station.

Incidentally, since VHF used as frequencies for TV stations usually has a wide range of frequencies, an adopted tuner is an electronic tuner of a circuit arranged such that signals are received from the two-divided bands of frequencies. A lower band and upper band of the frequencies are referred to as VHF Low band and VHF High band, respectively.

Therefore, the electronic tuner has control source's lines for the respective bands. This makes possible to receive signals in a broad frequency coverage of VHF in such a manner that in the case where the electronic tuner receives the VHF Low band, a voltage of a VHF Low control source turns High and a circuit of the VHF Low band operates, and in the case where the electronic tuner receives the VHF High band, a voltage of a VHF High control source turns High and a circuit of the VHF High band operates.

FIG. 11 is a block diagram showing a circuit arrangement of a stage before an AMP section shown in FIG. 10.

For example, an electronic tuner shown in FIG. 10 corrects a gain of VHF High band using a circuit (gain correction circuit 107) shown in FIG. 11.

Specifically, in the gain correction circuit 107 shown in FIG. 11, in the case where a voltage of the VHF High control source turns High, a voltage runs through R1 and a voltage appears at a cathode D1, which brings the cathode D1 into conduction. At this time, since the AMP has some input capacity, the circuit in FIG. 11 can be expressed equivalently as a circuit as shown in FIG. 12.

Here, when L1 is set to a proper value, filters occur at L1 and Ci, which can hold up a lower part of the gain. In other words, it is possible to flatly correct frequency characteristic inside a band (VHF High) by holding up a lower part of the gain.

Thus, the electronic tuner includes the foregoing gain correction circuit in some kind of form to improve the frequency characteristic at the VHF High band.

Further, the electronic tuner shown in FIG. 10 is subjected to IF interference described below, and deterioration of frequency characteristic, i.e. deterioration in performance of frequency characteristic occurs even in the VHF Low band.

It is desirable that the IF signal outputted from the IF-OUT terminal of the electronic tuner is a signal from the selected particular station. However, there is the possibility that other interfering signals which come in the electronic tuner due to various kinds of factors might cause deterioration in performance of frequency characteristic.

A typical example of factors of deterioration in performance of frequency characteristic is IF interference. This is an interference that in the case where an interfering signal having the same frequency as the IF signal exists in the RF-IN terminal, the interfering signal directly or indirectly passes through the circuit inside the electronic tuner and is outputted to the IF-OUT terminal, which deteriorates the signal for the selected particular station. This IF interference tends to occur at low frequencies, that is, frequencies close to those of IF signal (VHF Low band).

In order to improve the IF interference, for example, Japanese Utility Model Application Laid-Open Publication No. 105723/1992 (Jitsukaihei 4-105723, published on Sep. 11, 1992) discloses a technique of providing a trap circuit with at least one stage (variable trap circuit) inside the electronic tuner.

However, as described above, since the electronic tuner has been already provided with the gain correction circuit for the improvement of frequency characteristic at the VHF High band, provision of the trap circuit for the improvement of IF interference at the VHF Low band results in a large circuit configuration and price increase of the apparatus. Especially, for the proper improvement of IF interference, it is necessary to increase the number of stages in the trap circuit. Such a case results in a further large circuit configuration and further price increase of the apparatus.

SUMMARY OF THE INVENTION

An object of the present invention is to provide an electronic tuner which can minimize its price increase and improves frequency characteristic in a VHF High band and a VHF Low band.

Therefore, in order to achieve the above object, an electronic tuner according to the present invention which selectively receives two VHF frequency bands of a VHF High band and a VHF Low band, includes an amplifying circuit for amplifying a received signal; and a mixing circuit for mixing the received signal that has been amplified by the amplifying circuit with a local oscillation signal so as to perform frequency conversion, wherein between a ground and at least one of an input part of the amplifying circuit, an output part of the amplifying circuit, and an input part of the mixing circuit serially connected are a coil and a switching element in such a manner that the switching element is arranged on a side of the ground, and a capacitor is connected between the ground and a connecting part of the coil and the switching element, the switching element being brought into conduction when the VHF High band is selected and being brought out of conduction when the VHF Low band is selected.

According to the above arrangement, when the switching element is brought into conduction in response to switching to the VHF High band, the coil and any one of input capacitance of the amplifying circuit, output capacitance of the amplifying circuit, and input capacitance of the mixing circuit can make up a gain correction circuit for improving deterioration in frequency characteristic of a received signal in the VHF High band, and when the switching element is brought out of conduction in response to switching to the VHF Low band, the coil and the capacitor can make up a trap circuit for improving deterioration in frequency characteristic of a received signal in the VHF Low band.

Thus, it is possible to reduce a circuit size inside the apparatus in such an arrangement that the circuits (gain correction circuit and trap circuit) for improving deterioration in frequency characteristic for each band include a common component (coil) and are used by switching of the switching element, as compared to the arrangement in which the gain correction circuit and the trap circuit are separately included.

Besides, since the trap circuit is adapted to arrange only by provision of one coil in the gain correction circuit, it is possible to add the trap circuit as well as the gain correction circuit to the apparatus with a minimum cost increase (cost for one capacitor or so).

As described above, the electronic tuner as arranged above can minimize its price increase and improve frequency characteristic in a VHF High band and a VHF Low band.

Further, it may be arranged so that a power source which generates a band switch control voltage for switching VHF between the VHF High band and the VHF Low band, and the switching element is brought into conduction or out of conduction by application of the and switch control voltage.

In this case, since the switching element is adapted to switch between a conductive state and a nonconductive state when the band switch control voltage for use in switching between the VHF High band and the VHF Low band is applied to the switching element, it is not necessary to generate another voltage for causing the switching element to switch between a conductive state and a nonconductive state.

With this arrangement, an existing power source (power source which generates a band switch control voltage) can be used for the generation of the voltage necessary for the switching of the switching element between a conductive state and a nonconductive state. Therefore, it is possible to make a circuit of the apparatus simpler and realize lower costs.

The switching element may be replaced with a diode or a transistor.

In order to solve the above problem, an electronic tuner of the present invention which selectively receives two VHF frequency bands of a VHF High band and a VHF Low band, includes a first improvement section for improving a frequency characteristic of a signal in a received VHF High band;

a second improvement section for improving a frequency characteristic of a signal in a received VHF Low band; and a switching section for switching between the first improvement section and the second improvement section so that the first improvement section operates when a signal in the VHF High band is received, and the second improvement section operates when a signal in the VHF Low band is received.

According to the above arrangement, since the electronic tuner of the present invention has the switching section for switching between the first improvement section and the second improvement section such that the first improvement section operates when a signal in the VHF High band is received, and the second improvement section operates when a signal in the VHF Low band is received, deterioration in frequency characteristic of received signals in each band can be improved in conjunction with the switching between the VHF High band and the VHF Low band when a signal in VHF is received.

Thus, it is possible to share a circuit component, reduce a circuit size, and simplify a circuit in such an arrangement that the improvement of deterioration in frequency characteristic of a received signal in the VHF High band and the improvement of deterioration in frequency characteristic of a received signal in the VHF Low band can be done by switching, as compared to the arrangement in which the improvement of deterioration in frequency characteristics of received signals in the bands is realized by the respectively independent circuits.

Therefore, it is possible to minimize a price increase of the apparatus even in the case where circuits are added for the improvement of frequency characteristics in the VHF High band and the VHF Low band.

Further, the electronic tuner of the present invention may be arranged as a power source which generates a band switch control voltage for switching the VHF between the VHF High band and the VHF Low band so that the switching section switches between the first improvement section and the second improvement section when the band switch control voltage is applied to the switching section.

In this case, since the band switch control voltage for use in switching between the VHF High band and the VHF Low band is applied to the switching section so that switching operation of the switching section between the first improvement section and the second improvement section is performed, it is not necessary to generate another voltage for controlling the switching operation of the switching section.

With this arrangement, since it is not necessary to provide another voltage generating section which generates a voltage necessary for controlling the switching operation of the switching section and an existing power source can be used, it is possible to make a circuit of the apparatus simpler and realize lower costs.

For a fuller understanding of the nature and advantages of the invention, reference should be made to the ensuing detailed description taken in conjunction with the accompanying drawings.

DESCRIPTION OF THE EMBODIMENTS

The following will explain one embodiment of the present invention.

Figure 1:
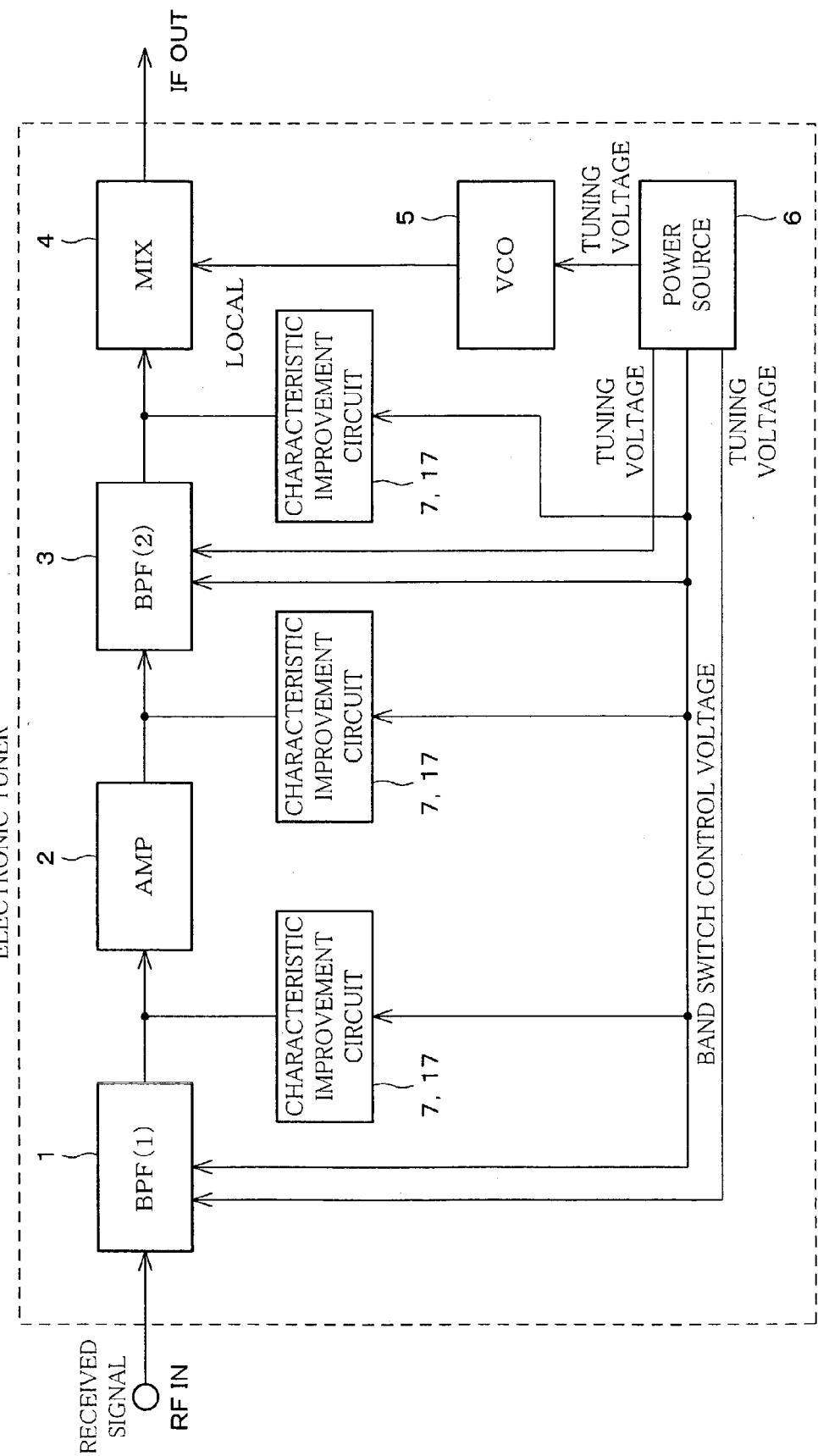
FIG. 1 is a block diagram schematically showing an electronic tuner according to one embodiment of the present invention.
Figure 2:
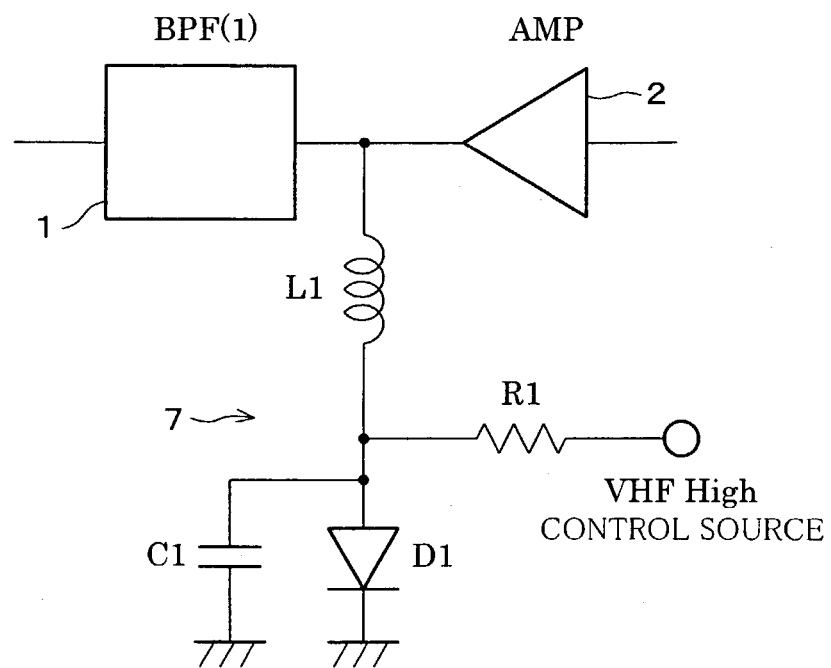
FIG. 2 is a block diagram of a characteristic improvement circuit which is connected to an input part of an amplifying circuit in the electronic tuner shown in FIG. 1, using a diode for a switching element.
Figure 3:
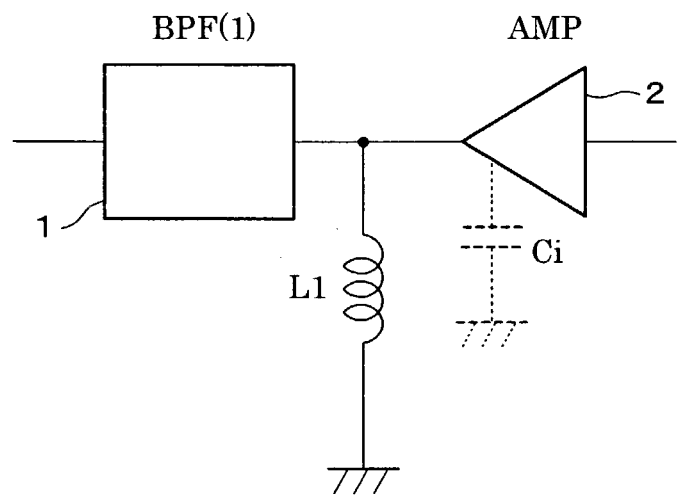
FIG. 3 is a diagram of an equivalent circuit for a gain correction circuit in the characteristic improvement circuit shown in FIG. 2.

An electronic tuner according to the present embodiment will be explained with reference to FIGS. 1 to 3. FIG. 1 shows a block diagram of the electronic tuner, FIG. 2 shows a block diagram of a circuit, which is provided in the electronic tuner shown in FIG. 1, for improving a frequency characteristic, and FIG. 3 shows a view of an equivalent circuit for the block circuit shown in FIG. 2.

The electronic tuner according to the present embodiment, which is an electronic tuner that selectively receives two frequency bands of VHF in accordance with a band switch control voltage, has an arrangement in which a band-pass filter 1 (BPF (1)), an amplifying circuit 2 (AMP), a band-pass filter 3 (BPF (2)), and a mixer circuit 4 (MIX) are serially connected between an RF-IN terminal and an IF-OUT terminal.

The mixer circuit (mixing circuit) 4 is connected to a local oscillator circuit 5 (VCO) which generates a local oscillation signal (LOCAL) in accordance with a tuning voltage from a power source and outputs the local oscillation signal to the mixer circuit 4.

Between the band-pass filter 1 and the amplifying circuit 2 connected is a characteristic improvement circuit 7 for improving the frequency characteristic of received signals. Moreover, between the amplifying circuit 2 and the band-pass filter 3 and between the band-pass filter 3 and mixer circuit 4 provided are the respective characteristic improvement circuits 7 for improving the frequency characteristic of received signals. Note that, the characteristic improvement circuit 7 will be specifically described later.

Further, the power source 6 is adapted so as to apply tuning voltages to the band-pass filters 1 and 3 as well as the local oscillator circuit 5. In addition, the power source 6 is adapted so as to apply the above-described band switch control voltages to the band-pass filters 1 and 3, and the respective characteristic improvement circuits 7. Thus, the power source 6 serves as both of tuning voltage generating means and band switch control voltage generating means.

The electronic tuner of the above arrangement will be explained below.

As shown in FIG. 1, receiver signals supplied from the RF-IN terminal of the electronic tuner as a station-selecting section are first screened to pick out only a desired signal by the band-pass filter 1 which operates in accordance with the tuning voltage from the power source 6. Thereafter, the desired signal goes to the amplifying circuit 2 to be amplified. Next, the amplified receiver signal is further screened by the band-pass filter 3 which operates in accordance with the tuning voltage from the power source 6, and goes to the mixer circuit 4.

The mixer circuit 4 is adapted to receive the local oscillation signal from the local oscillator circuit 5, and to perform frequency conversion by mixture of the receiver signal with the local oscillation signal and output the frequency-converted receiver signal to the IF-OUT terminal.

This signal outputted to the IF-OUT terminal is referred to as IF signal. The frequency of this IF signal is determined by the difference in frequency between the local oscillation signal and the receiver signal.

Therefore, since the frequency of local oscillation signal is changed in proportion to the desired signal supplied from the RF-IN terminal, the frequency of IF signal is always constant.

Thus, the frequency of the IF signal is always constant, so that it is possible to select only a particular station and receive a program from the selected station.

Incidentally, since VHF used as frequencies for TV stations usually has a wide range of frequencies, an adopted tuner is an electronic tuner of a circuit arranged such that signals are received from the two-divided bands of frequencies. A lower band and upper band of the frequencies are referred to as VHF Low band and VHF High band, respectively.

Therefore, the electronic tuner selectively receives a VHF High band signal and a VHF Low band signal by applying the band switch control voltages from the power source 6 to the band-pass filters 1 and 3. For example, when the band switch control voltage is at High level, the band-pass filters 1 and 3 adapt their circuits so as to receive a signal of VHF High band. When the band switch control voltage is at Low level, the band-pass filters 1 and 3 adapt their circuits so as to receive a signal of VHF Low band.

The band switch control voltage is controlled in accordance with a control signal supplied to the power source 6 (control signal corresponding to the channel generated when a user makes channel operation).

Incidentally, there is the problem that the receiver signal of the VHF High band deteriorates in frequency characteristic due to decrease in gain, and the receiver signal of the VHF Low band is affected by the IF interference, resulting in the deterioration in frequency characteristic.

In order to solve the problems, as described above, the characteristic improvement circuit 7 is provided as frequency characteristic improvement means to improve deterioration in frequency characteristic of the receiver signal in each band.

The deterioration in frequency characteristic occurs at the parts between the band-pass filter 1 and the amplifying circuit 2, between the amplifying circuit 2 and the band-pass filter 3, between the band-pass filter 3 and the mixer circuit 4. Although it is desirable to improve all of the parts, the deterioration in frequency characteristic for at least one part may be improved.

The following will explain a specific arrangement and operation of the characteristic improvement circuit 7.

Figure 4:
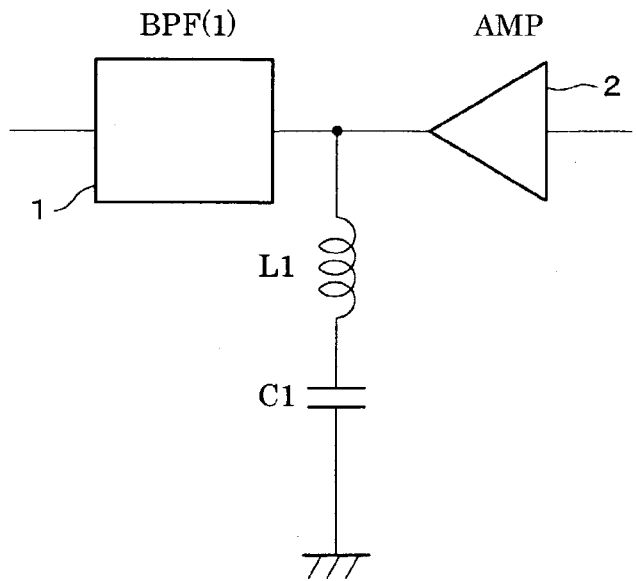
FIG. 4 is a diagram of an equivalent circuit for a trap circuit in the characteristic improvement circuit shown in FIG. 2.

First, referring to FIGS. 2 to 4, the following will explain the characteristic improvement circuit 7 provided between the band-pass filter 1 and the amplifying circuit 2. In other words, the following will explain an example of the characteristic improvement circuit 7 provided at an input part of the amplifying circuit 2.

FIG. 2 shows a specific circuit diagram of the characteristic improvement circuit 7, FIG. 3 shows an equivalent circuit for the circuit shown in FIG. 2 at the time of receiving a VHF High band signal, and FIG. 4 shows an equivalent circuit for the circuit shown in FIG. 2 at the time of receiving a VHF Low band signal.

In the characteristic improvement circuit 7 shown in FIG. 2, a coil L1 and a diode D1 as switching element (switching part) are serially connected between the input part of the amplifying circuit 2 and the ground, and a capacitor C1 is connected between a connecting part between the coil L1 and the diode D1 and the ground. That is, the diode D1 and the capacitor C1 are connected in parallel.

Further, the diode D1 is connected to VHF High control source via a resistor R1. In other words, the diode D1 turns ON/OFF in accordance with the voltage applied from the VHF High control source. The VHF High control source, which is the power source 6 of the electronic tuner shown in FIG. 1, generates the band switch control voltage.

Here, it is assumed that when the VHF High control voltage is at High level, the band-pass filters 1 and 3 switch to the circuits for receiving a VHF High band signal, and when the VHF High control voltage is at Low level, the band-pass filters 1 and 3 switch to the circuits for receiving a VHF Low band signal.

Figure 12:
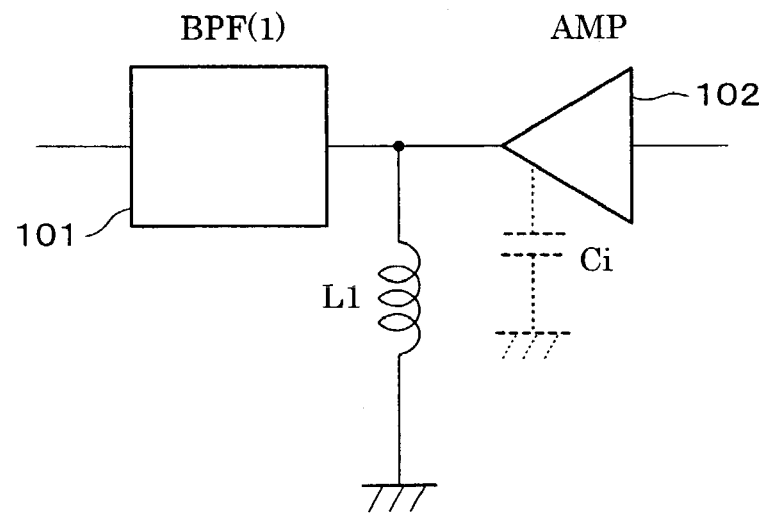
FIG. 12 is a view showing an equivalent circuit for the gain correction circuit shown in FIG. 11.

Therefore, when a voltage supplied from the VHF High control source is at High level, the circuit in FIG. 2 is switched to a circuit for receiving a VHF High band signal, and the diode Dl as switching element is brought into conduction. In this case, the capacitor Cl makes up a gain correction circuit (input capacitance Ci that the coil Li and the amplifying circuit have) as shown in FIG. 3 without affecting the circuit, and operates as gain correction circuit (first improvement section). As to this gain correction circuit, detailed explanations are omitted here because it is the same as that shown in and with reference to FIG. 12.

On the other hand, when a voltage supplied from the VHF High control source is at Low level, the circuit shown in FIG. 2 is switched to a circuit for receiving a VHF Low band signal. However, no voltage is applied to the diode D1, which brings the diode D1 out of conduction. In this case, it is considered that the diode D1 is equivalent of nonexistence, so that such a circuit as shown in FIG. 4 is made up.

In a circuit shown in FIG. 4, it is possible to make up a trap circuit (second improvement section) corresponding to a frequency of IF signal when appropriate values are given to a length of coil L1 and a capacitance of the capacitor C1. In other words, the above arrangement can obtain the same effects as an arrangement in which a trap circuit for improving IF interference is added to the circuit.

Further, the same capacitance as that of the input part, i.e., output capacitance, also exists at an output part of the amplifying circuit 2. Therefore, provision of the characteristic improvement circuit 7 between the amplifying circuit 2 and the band-pass filter 3, as shown in FIG. 5, can also obtain the same effects as previously described.

Figure 5:
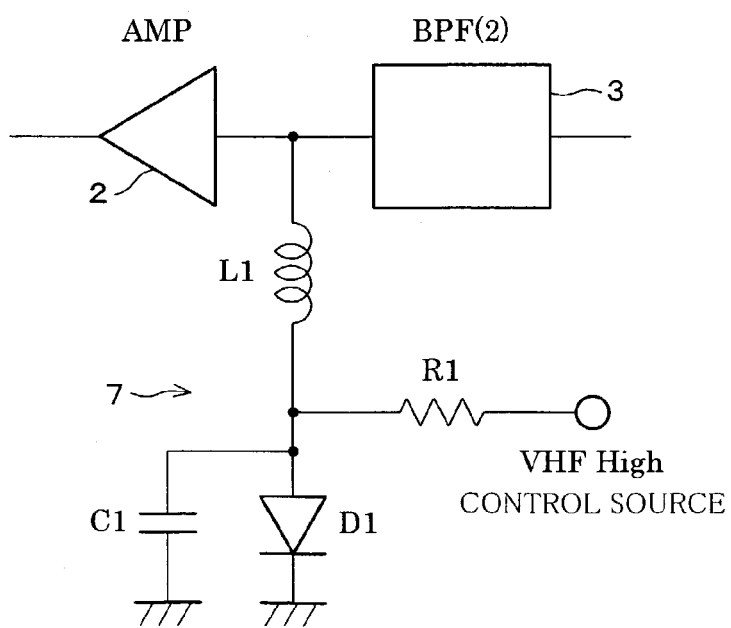
FIG. 5 is a block diagram of a characteristic improvement circuit which is connected to an output part of an amplifying circuit in the electronic tuner shown in FIG. 1, using a diode for a switching element.

Specifically, when the voltage supplied from the VHF High control source is at High level, a circuit shown in FIG. 5 is switched to a circuit for receiving a VHF High band signal, and the diode D1 as switching element is brought into conduction. In this case, the capacitor C1 makes up a gain correction circuit as shown in FIG. 3 without affecting the circuit, and operates as gain correction circuit. Note that, in this case, the capacitance Ci is not provided at the input part of the amplifying circuit 2, but at the output part of the amplifying circuit 2 unlike the arrangement of FIG. 3.

On the other hand, when the voltage supplied from the VHF High control source is at Low level, the circuit shown in FIG. 5 is switched to a circuit for receiving a VHF Low band signal. However, no voltage is applied to the diode D1, which brings the diode D1 out of conduction. In this case, it is considered that the diode D1 is equivalent of nonexistence, so that that such a circuit as shown in FIG. 4 is made up.

In this case, it is possible to make up a trap circuit corresponding to a frequency of IF signal when appropriate values are given for a length of coil L1 and a capacitance of the capacitor C1. In other words, the above arrangement can obtain the same effects as an arrangement in which a trap circuit for improving IF interference is added to the circuit.

Further, the same input capacitance as that of the input part of the amplifying circuit 2 also exists at an input part of the mixer circuit 4. Therefore, provision of the characteristic improvement circuit 7 between the band-pass filter 3 and the mixer circuit 4, as shown in FIG. 6, can also obtain the same effects as previously described.

Figure 6:
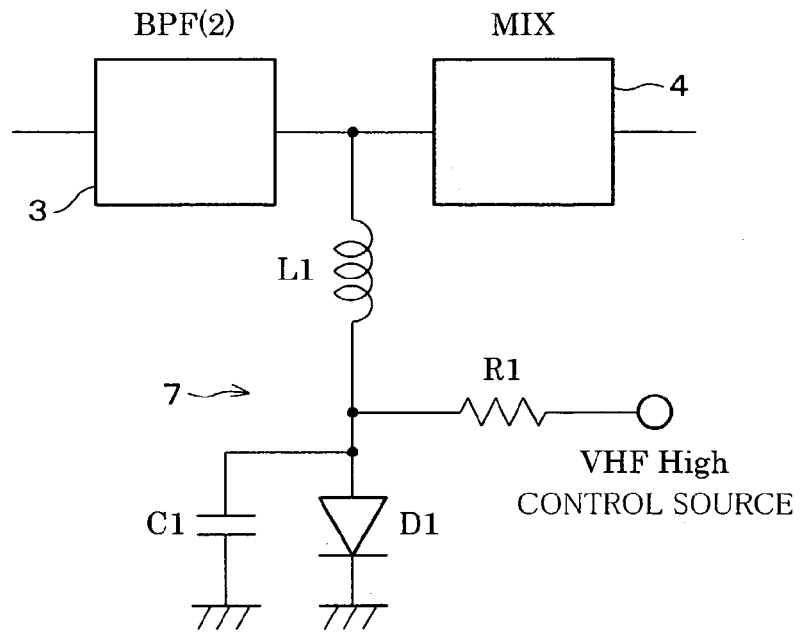
FIG. 6 is a block diagram of a characteristic improvement circuit which is connected to an input part of a mixer circuit in the electronic tuner shown in FIG. 1, using a diode for a switching element.

Specifically, when the voltage supplied from the VHF High control source is at High level, a circuit shown in FIG. 6 is switched to a circuit for receiving a VHF High band signal, and the diode D1 as switching element is brought into conduction. In this case, the capacitor C1 makes up a gain correction circuit as shown in FIG. 3 without affecting the circuit, and operates as gain correction circuit. Note that, in this case, the capacitance Ci is not provided at the input part of the amplifying circuit 2, but at the input part of the mixer circuit 4 unlike the arrangement of FIG. 3.

On the other hand, when the voltage supplied from the VHF High control source is at Low level, the circuit shown in FIG. 6 is switched to a circuit for receiving a VHF Low band signal. However, no voltage is applied to the diode D1, which brings the diode D1 out of conduction. In this case, it is considered that the diode D1 is equivalent of nonexistence, so that that such a circuit as shown in FIG. 4 is made up.

In this case, it is possible to make up a trap circuit corresponding to a frequency of IF signal when appropriate values are given for a length of coil L1 and a capacitance of the capacitor C1. In other words, the above arrangement obtains the same effects as an arrangement in which a trap circuit for improving the IF interference is added to the circuit.

Figure 7:
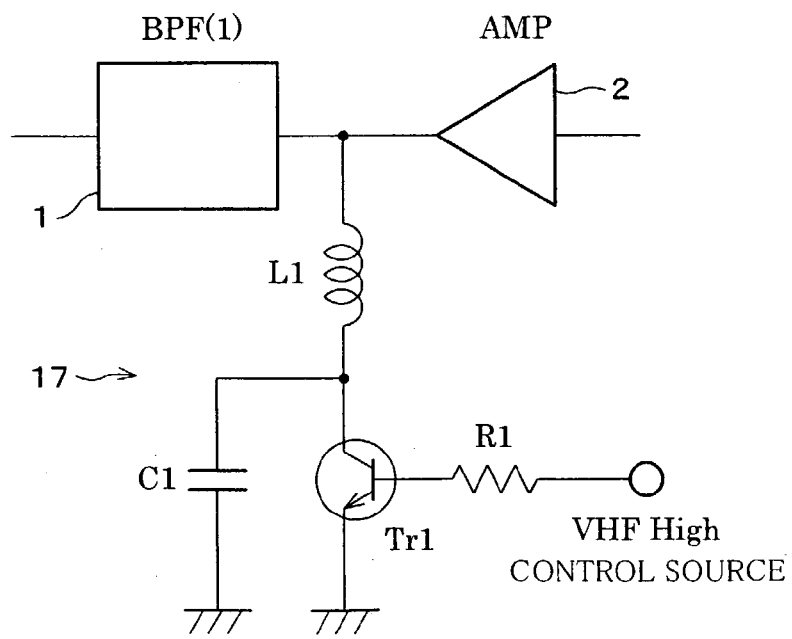
FIG. 7 is a block diagram of a characteristic improvement circuit which is connected to an input part of an amplifying circuit in the electronic tuner shown in FIG. 1, using a transistor for a switching element.
Figure 8:
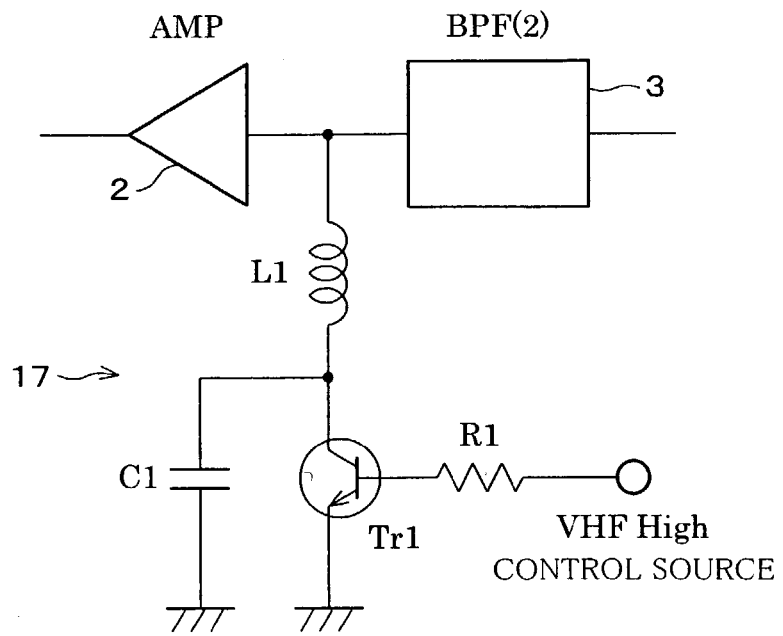
FIG. 8 is a block diagram of a characteristic improvement circuit which is connected to an output part of an amplifying circuit in the electronic tuner shown in FIG. 1, using a transistor for a switching element.
Figure 9:
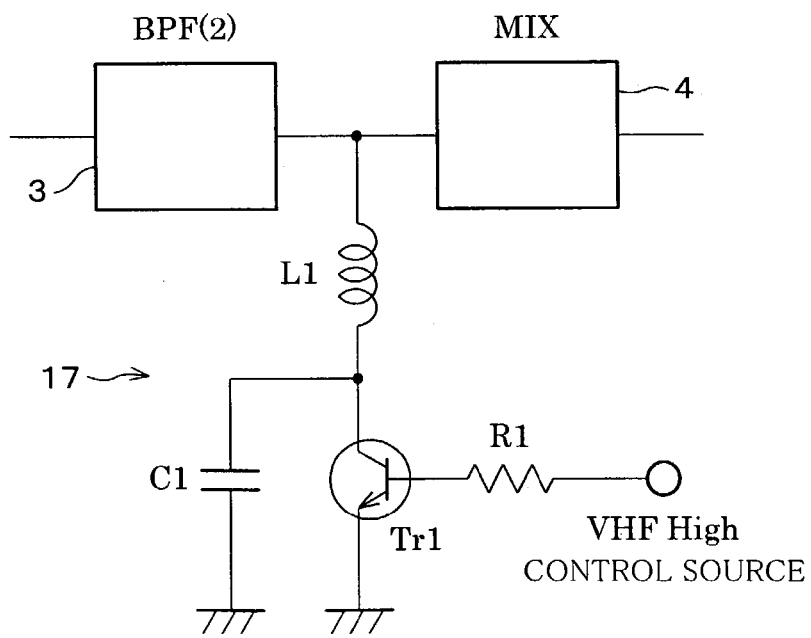
FIG. 9 is a block diagram of a characteristic improvement circuit which is connected to an input part of a mixer circuit in the electronic tuner shown in FIG. 1, using a transistor for a switching element.
Figure 10:
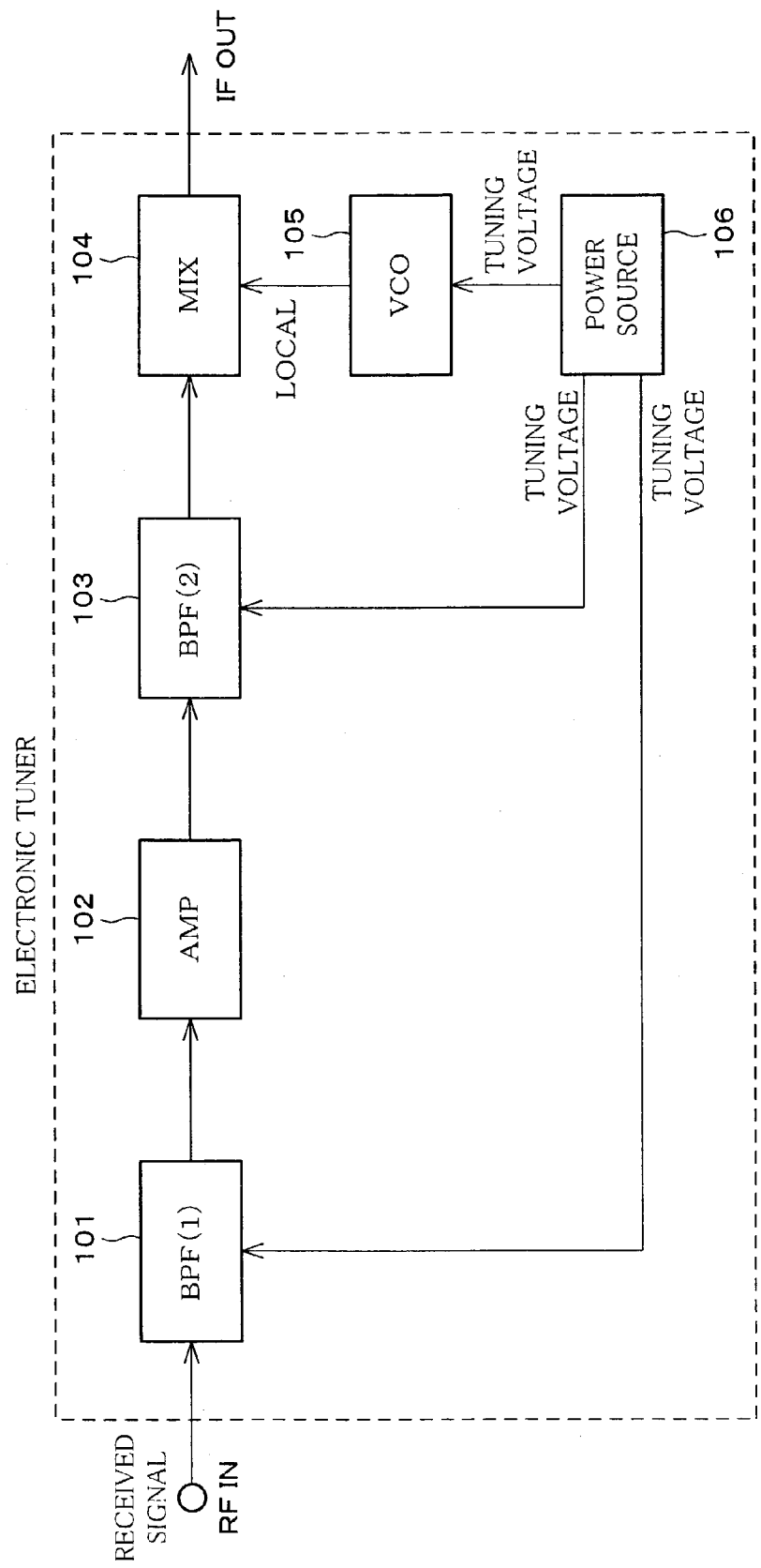
FIG. 10 is a block diagram schematically showing a typical electronic tuner.
Figure 11:
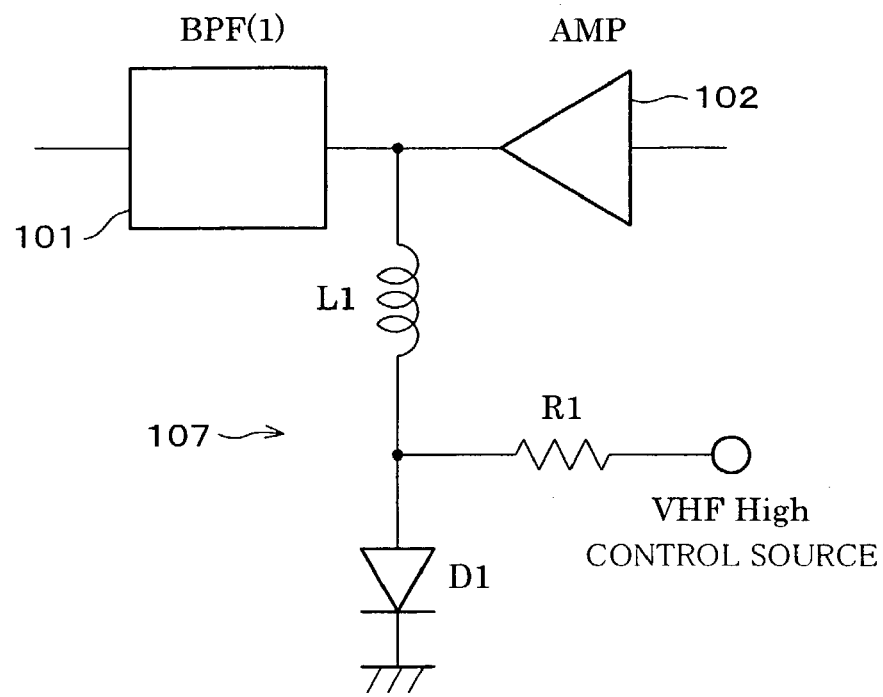
FIG. 11 is a block diagram showing a gain correction circuit provided in the electronic tuner shown in FIG. 10.

Further, the same effects can be obtained when a transistor Tr1 is adopted instead of the diode D1 as switching element, as shown in FIGS. 7 to 9.

FIG. 7 shows a characteristic improvement circuit 17 which is provided with the transistor Tr1 instead of the diode D1 in the circuit shown in FIG. 2, FIG. 8 shows a characteristic improvement circuit 17 which is provided with the transistor Tr1 instead of the diode D1 in the circuit shown in FIG. 5, and FIG. 9 is a characteristic improvement circuit 17 which is provided with the transistor Tr1 instead of the diode D1 in the circuit shown in FIG. 6.

Thus, the characteristic improvement circuit 17's basic operation is almost the same even when the diode D1 is replaced with the transistor Tr1. More specifically, while the diode D1 operates in accordance with the potential difference between a cathode and an anode, the transistor Tr1 performs switching of a collector-emitter in accordance with the potential difference between a base and an emitter.

The circuit shown in FIG. 7, when the voltage supplied from the VHF High control source is at High level, is switched to a circuit for receiving a VHF High band signal, which brings the collector-emitter of the transistor Tr1 as switching element into conduction. In this case, the capacitor C1 makes up a gain correction circuit (input capacitance Ci that the coil L1 and the amplifying circuit have) as shown in FIG. 3 without affecting the circuit, and operates as gain correction circuit.

On the other hand, when the voltage supplied from the VHF High control source is at Low level, the circuit shown in FIG. 7 is switched to a circuit for receiving a VHF Low band signal, which brings the collector-emitter of the transistor tr1 out of conduction. In this case, it is considered that the transistor Tr1 is equivalent of nonexistence, so that such a circuit as shown in FIG. 4 is made up.

In a circuit shown in FIG. 4, it is possible to make up a trap circuit corresponding to a frequency of IF signal when appropriate values are given for a length of coil L1 and a capacitance of the capacitor C1. In other words, the above arrangement can obtain the same effects as an arrangement in which a trap circuit for improving IF interference is added to the circuit.

Further, when the voltage supplied from the VHF High control source is at High level, a circuit shown in FIG. 8 is switched to a circuit for receiving a VHF High band signal, which brings the collector-emitter of the transistor Tr1 as switching element into conduction. In this case, the capacitor C1 makes up a gain correction circuit as shown in FIG. 3 without affecting the circuit, and operates as gain correction circuit. Note that, in this case, the capacitance Ci is not provided at the input part of the amplifying circuit 2, but at the output part of the amplifying circuit 2 unlike the arrangement of FIG. 3.

On the other hand, when the voltage supplied from the VHF High control source is at Low level, the circuit shown in FIG. 8 is switched to a circuit for receiving a VHF Low band signal, which brings the collector-emitter of the transistor Tr1 out of conduction. In this case, it is considered that the transistor Tr1 is equivalent of nonexistence, so that such a circuit as shown in FIG. 4 is made up.

In this case, it is possible to make up a trap circuit corresponding to a frequency of IF signal when appropriate values are given for a length of coil L1 and a capacitance of the capacitor C1. In other words, the above arrangement can obtain the same effects as an arrangement in which a trap circuit for improving IF interference is added to the circuit.

Further, when the voltage supplied from the VHF High control source is at High level, a circuit shown in FIG. 9 is switched to a circuit for receiving a VHF High band signal, which brings the collector-emitter of the transistor Tr1 as switching element into conduction. In this case, the capacitor C1 makes up a gain correction circuit as shown in FIG. 3 without affecting the circuit, and operates as gain correction circuit. Note that, in this case, the capacitance Ci is not provided at the input part of the amplifying circuit 2, but at the input part of the mixer circuit 4 unlike the arrangement of FIG. 3.

On the other hand, when the voltage supplied from the VHF High control source is at Low level, the circuit shown in FIG. 9 is switched to a circuit for receiving a VHF Low band signal, which brings the collector-emitter of the transistor Tr1 out of conduction. In this case, it is considered that the transistor Tr1 is equivalent of nonexistence, so that that such a circuit as shown in FIG. 4 is made up.

In this case, it is possible to make up a trap circuit corresponding to a frequency of IF signal when appropriate values are given for a length of coil L1 and a capacitance of the capacitor C1. In other words, the above arrangement can obtain the same effects as an arrangement in which a trap circuit for improving IF interference is added to the circuit.

As described above, provision of the characteristic improvement circuit 7 or 17 in the electronic tuner prevents the deterioration in frequency characteristic of a signal received from the VHF High band and prevents the deterioration in frequency characteristic of a signal received from the VHF Low band.

In addition, the trap circuit for improving the deterioration in frequency characteristic of a signal from the VHF Low band can be realized only by providing one capacitor in the gain correction circuit for improving the deterioration in frequency characteristic of a signal from the VHF High band. Further, the switching between the trap circuit and the gain correction circuit is carried out in accordance with the band switch control voltage, which does not require any special switching circuit.

Therefore, since the trap circuit does not need to be changed to another circuit that is different from the gain correction circuit, it is possible to improve the frequency characteristic of signals from the VHF High band and the VHF Low band without increasing a circuit size of the apparatus.

Further, since only provision of one capacitor in the gain correction circuit creates the trap circuit, without providing a separate trap circuit, it is possible to reduce a price increase in the device in comparison, compared with mere addition of the trap circuit.

Note that, the present embodiment has explained an example wherein the characteristic improvement circuit 7 or 17 is provided at all of the parts between the bandpass filter 1 and the amplifying circuit 2, between the amplifying circuit 2 and the band-pass filter 3, and between the band-pass filter 3 and the mixer circuit 4, as shown in FIG. 1. However, provision of at least one characteristic improvement circuit 7 or 17 can improve both frequency characteristics of signals from both VHF High band and VHF Low band.

Therefore, provision of one characteristic improvement circuit 7 or 17 for each apparatus makes up the following arrangement.

Specifically, the electronic tuner of the present invention is an electronic tuner receiving two-divided VHF bands, in which a coil L1 and a diode D1 for switching are connected serially between an input part of an RF amplifier (amplifying circuit 2) and the ground, the diode D1 is connected in parallel to a capacitor C1, and the diode D1 is switched in accordance with a control voltage (band switch control voltage) for switching between VHF bands. This arrangement corresponds to that of the circuit shown in FIG. 2.

Further, the electronic tuner of the present invention is an electronic tuner receiving two-divided VHF bands, in which a coil L1 and a diode D1 for switching are connected serially between an output part of an RF amplifier (amplifying circuit 2) and the ground, the diode D1 is connected in parallel to a capacitor C1, and the diode D1 is switched in accordance with a control voltage (band switch control voltage) for switching between VHF bands. This arrangement corresponds to that of the circuit shown in FIG. 5.

Yet further, the electronic tuner of the present invention is an electronic tuner receiving two-divided VHF bands, in which a coil L1 and a diode D1 for switching are connected serially between an input part of a mixer circuit 4 and the ground, the diode D1 is connected in parallel to a capacitor C1, and the diode D1 is switched in accordance with a control voltage (band switch control voltage) for switching between VHF bands. This arrangement corresponds to that of the circuit shown in FIG. 6.

Further, the electronic tuner of the present invention is an electronic tuner receiving two-divided VHF bands, in which a coil L1 and an emitter-collector of transistor Tr1 for switching are connected serially between an input part of an RF amplifier (amplifying circuit 2) and the ground, the emitter-collector of the transistor Tr1 is connected to a capacitor C1, and a control voltage (band switch control voltage) for switching between VHF bands is applied to a base of the transistor Tr1 so that the control voltage switches the transistor Tr1 on and off. This arrangement corresponds to that of the circuit shown in FIG. 7.

Yet further, the electronic tuner of the present invention is an electronic tuner receiving two-divided VHF bands, in which a coil L1 and an emitter-collector of transistor Tr1 for switching are connected serially between an output part of an RF amplifier (amplifying circuit 2) and the ground, the emitter-collector of the transistor Tr1 is connected to a capacitor C1, and a control voltage (band switch control voltage) for switching between VHF bands is applied to a base of the transistor Tr1 so that the control voltage switches the transistor Tr1 on and off. This arrangement corresponds to that of the circuit shown in FIG. 8.

Still further, the electronic tuner of the present invention is an electronic tuner receiving two-divided VHF bands, in which a coil L1 and an emitter-collector of transistor Tr1 for switching are connected serially between an input part of a mixer circuit 4 and the ground, the emitter—collector of the transistor Tr1 is connected to a capacitor C1, and a control voltage (band switch control voltage) for switching between VHF bands is applied to a base of the transistor Tr1 so that the control voltage switches the transistor Tr1 on and off. This arrangement corresponds to that of the circuit shown in FIG. 9.

Besides, the characteristic improvement circuits 7 and 17 can be used by mixture. For example, an electronic tuner may be arranged using the characteristic improvement circuit 7 shown in FIG. 2, the characteristic improvement circuit 7 shown in FIG. 5, and the characteristic improvement circuit 17 shown in FIG. 9. Similarly, an electronic tuner may be arranged using the characteristic improvement circuit 7 shown in FIG. 2, the characteristic improvement circuit 17 shown in FIG. 8, and the characteristic improvement circuit 7 shown in FIG. 6. Further, an electronic tuner may be arranged using the characteristic improvement circuit 7 shown in FIG. 2, the characteristic improvement circuit 17 shown in FIG. 8, and the characteristic improvement circuit 17 shown in FIG. 9. Yet further, an electronic tuner may be arranged using the characteristic improvement circuit 17 shown in FIG. 7, the characteristic improvement circuit 7 shown in FIG. 5, and the characteristic improvement circuit 7 shown in FIG. 6. Still further, an electronic tuner may be arranged using the characteristic improvement circuit 17 shown in FIG. 7, the characteristic improvement circuit 7 shown in FIG. 5, and the characteristic improvement circuit 17 shown in FIG. 9. Further, an electronic tuner may be arranged using the characteristic improvement circuit 17 shown in FIG. 7, the characteristic improvement circuit 17 shown in FIG. 8, and the characteristic improvement circuit 7 shown in FIG. 6.

As described above, if the electronic tuner of the present invention is used for a receiver of apparatuses such as TV, VTR, and CATV, it is possible to provide an apparatus that improves its performance while keeping its prices down.

Further, the present embodiment has described an example of using a diode and a transistor for a switching element. The diode is usually used because it is possible to manufacture the electronic tuner at lower costs by using the diode than by using the transistor.

However, no voltage is applied to the diode at 0V of the VHF High control voltage. In the case where a high-field signal comes in the electronic tuner in this state, its operation becomes unstable. In this case, the transistor is therefore used for a switching element. Note that, problems can be caused only by a fairly high-field signal, so that a diode is usually used for a switching element.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An electronic tuner which selectively receives two VHF frequency bands of a VHF High band and a VHF Low band, the electronic tuner comprising:
   an amplifying circuit for amplifying a received signal; and
   a mixing circuit for mixing the received signal that has been amplified by the amplifying circuit with a local oscillation signal so as to perform frequency conversion,
   wherein between a ground and at least one of an input part of the amplifying circuit, an output part of the amplifying circuit, and an input part of the mixing circuit serially connected are a coil and a switching element in such a manner that the switching element is arranged on a side of the ground, and a capacitor is connected between the ground and a connecting part of the coil and the switching element,
   the switching element being brought into conduction when the VHF High band is selected and being brought out of conduction when the VHF Low band is selected.

2. The electronic tuner according to claim 1, further comprising a power source which generates a band switch control voltage for switching a VHF between the VHF High band and the VHF Low band,
   wherein the switching element is brought into conduction or out of conduction when the band switch control voltage is applied to the switching element.

3. The electronic tuner according to claim 1, wherein the switching element is a diode.

4. The electronic tuner according to claim 1, wherein the switching element is a transistor.

5. An electronic tuner which selectively receives two VHF frequency bands of a VHF High band and a VHF Low band, the electronic tuner comprising:
- a first improvement section for improving a frequency characteristic of a signal in a received VHF High band;
- a second improvement section for improving a frequency characteristic of a signal in a received VHF Low band; and
- a switching section for switching between the first improvement section and the second improvement section so that the first improvement section operates when a signal in the VHF High band is received, and the second improvement section operates when a signal in the VHF Low band is received, wherein
  - the first improvement section includes a coil serially connected to the switching section, and
  - the second improvement section includes the coil, and a capacitor which is (i) connected to the coil, (ii) connected in parallel to the switching section.

6. The electronic tuner according to claim 5, further comprising a power source which generates a band switch control voltage for switching a VHF between the VHF High band and the VHF Low band, wherein the switching section switches between the first improvement section and the second improvement section when the band switch control voltage is applied to the switching section.

7. The electronic tuner according to claim 5, wherein the switching section is a diode.

8. The electronic tuner according to claim 5, wherein the switching section is a transistor.

* * * * *